United States Patent
Moriwaki

(10) Patent No.: US 9,484,083 B2
(45) Date of Patent: Nov. 1, 2016

(54) SEMICONDUCTOR DEVICE AND SEMICONDUCTOR STORAGE DEVICE

(71) Applicant: Socionext, Inc., Yokohama-shi, Kanagawa (JP)

(72) Inventor: Shinichi Moriwaki, Fussa (JP)

(73) Assignee: Socionext, Inc., Yokohama (JP)

( * ) Notice: Subject to any disclaimer, the term of this patent is extended or adjusted under 35 U.S.C. 154(b) by 0 days.

(21) Appl. No.: 14/611,970

(22) Filed: Feb. 2, 2015

(65) Prior Publication Data
US 2015/0279449 A1 Oct. 1, 2015

(30) Foreign Application Priority Data
Mar. 28, 2014 (JP) .................................. 2014-069438

(51) Int. Cl.
*G11C 8/08* (2006.01)
*G11C 11/417* (2006.01)
*G11C 5/02* (2006.01)
*G11C 5/14* (2006.01)

(52) U.S. Cl.
CPC ............... *G11C 11/417* (2013.01); *G11C 5/02* (2013.01); *G11C 5/148* (2013.01); *G11C 8/08* (2013.01)

(58) Field of Classification Search
CPC ....................................................... G11C 8/08
USPC ..................................................... 365/230.06
See application file for complete search history.

(56) References Cited

U.S. PATENT DOCUMENTS

| 5,274,601 A * | 12/1993 | Kawahara ................ G11C 5/14 327/427 |
| 7,944,000 B2* | 5/2011 | Ohtsuka .............. H01L 27/0802 257/344 |
| 2004/0042326 A1* | 3/2004 | Ashizawa ............. G11C 11/418 365/232 |
| 2006/0104107 A1* | 5/2006 | Remington ........... G11C 11/413 365/154 |
| 2008/0037358 A1* | 2/2008 | Yabuuchi ............... G11C 5/147 365/230.06 |

FOREIGN PATENT DOCUMENTS

| JP | 08-234877 A | 9/1996 |
| JP | 2001-176270 A | 6/2001 |
| JP | 2008-521157 A1 | 6/2008 |
| WO | WO 2006/055190 A1 | 5/2006 |

* cited by examiner

Primary Examiner — Min Huang
(74) Attorney, Agent, or Firm — Arent Fox LLP

(57) ABSTRACT

A semiconductor device includes a circuit block that is switchable between selection and non-selection, and a leakage current control circuit disposed between the circuit block and a first power supply line. The leakage current control circuit includes a first transistor disposed between the circuit block and the first power supply line, and a resistor device disposed between the circuit block and the first power supply line.

16 Claims, 17 Drawing Sheets

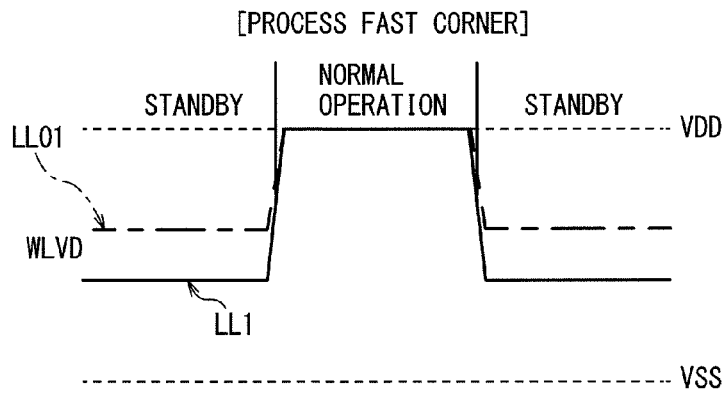
FIG. 13A
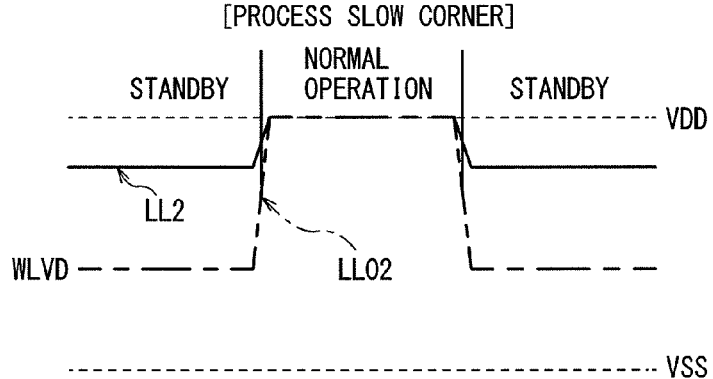
FIG. 13B
FIG. 14
|  | PROCESS FAST CORNER ||| PROCESS SLOW CORNER |||
| --- | --- | --- | --- | --- | --- | --- |
|  | VOLTAGE LEVEL | REDUCTION EFFECT FOR LEAKAGE CURRENT | RETURN TIME | VOLTAGE LEVEL | REDUCTION EFFECT FOR LEAKAGE CURRENT | RETURN TIME |
| COMPARATIVE EXAMPLE | HIGH | SMALL | FAST | LOW | SMALL | SLOW |
| FIRST EMBODIMENT | LOW | LARGE | AVERAGE | HIGH | SUBSTANTIALLY NONE | FAST |

SEMICONDUCTOR DEVICE AND SEMICONDUCTOR STORAGE DEVICE

CROSS-REFERENCE TO RELATED APPLICATION

This application is based upon and claims the benefit of priority of the prior Japanese Patent Application No. 2014-069438, filed on Mar. 28, 2014, the entire contents of which are incorporated herein by reference.

FIELD

The embodiments discussed herein are related to a semiconductor device and a semiconductor storage device.

BACKGROUND

Over recent years, with the advance of semiconductor manufacturing technology, semiconductor devices (transistors) have been miniaturized and highly integrated, and the number of transistors mounted on semiconductor chips (LSIs) is steadily increasing.

An increase in leakage current of a transistor alone resulting from miniaturization and an increase in the number of transistors mounted on a semiconductor chip cause leakage current (leakage power) of the entire semiconductor chip to tend to increase more and more.

On the other hand, less power consumption is desired for semiconductor chips for applications to battery-driven mobile devices and for energy conservation achievements.

For example, an SRAM (Static Random Access Memory: semiconductor storage device) accounts for a large percentage in a semiconductor chip and therefore, leakage reduction for the SRAM is important to reduce consumed power of the entire semiconductor chip.

In other words, an SRAM is used, for example, as a cache memory of an arithmetic processing unit (processor) and a memory for executing high-speed processing. In such an SRAM, especially, a leakage current of a word line driver is very large and accounts for most of a leakage current of an SRAM macro, for example.

As described above, for example, a leakage current of a word line driver in an SRAM is increasing with miniaturization and high integration of transistors, which is contrary to a recent demand for less power consumption.

In a word line driver of an SRAM, for example, a power supply line of a final stage inverter driving a word line takes long time for charge and discharge due to large parasitic capacitance. Therefore, for example, a voltage of a power supply line of the word line driver is dynamically controlled to reduce consumed power, resulting in a decrease in operation speed.

The present embodiment is applied to an SRAM without limitation and is also applicable to various semiconductor storage devices including, for example, a DRAM (Dynamic Random Access Memory). Further, the present embodiment is widely applicable to various semiconductor devices including, for example, a selection/non-selection-switchable circuit block.

In this regard, various semiconductor storage devices for reducing a leakage current have been proposed.

Patent Document 1: Japanese Laid-open Patent Publication No. 2008-521157

Patent Document 2: Japanese Laid-open Patent Publication No. 2001-176270

Patent Document 3: Japanese Laid-open Patent Publication No. H08-234877

SUMMARY

According to an aspect of the embodiments, there is provided a semiconductor device including a circuit block that is switchable between selection and non-selection, and a leakage current control circuit disposed between the circuit block and a first power supply line.

The leakage current control circuit includes a first transistor disposed between the circuit block and the first power supply line, and a resistor device disposed between the circuit block and the first power supply line.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13A and FIG. 13B are diagrams for describing an operation of the word line driver illustrated in FIG. 9;

FIG. 14 is a table for describing the word line driver illustrated in FIG. 9 by comparison with the word line driver illustrated in FIG. 6;

DESCRIPTION OF EMBODIMENTS

Figure 1:
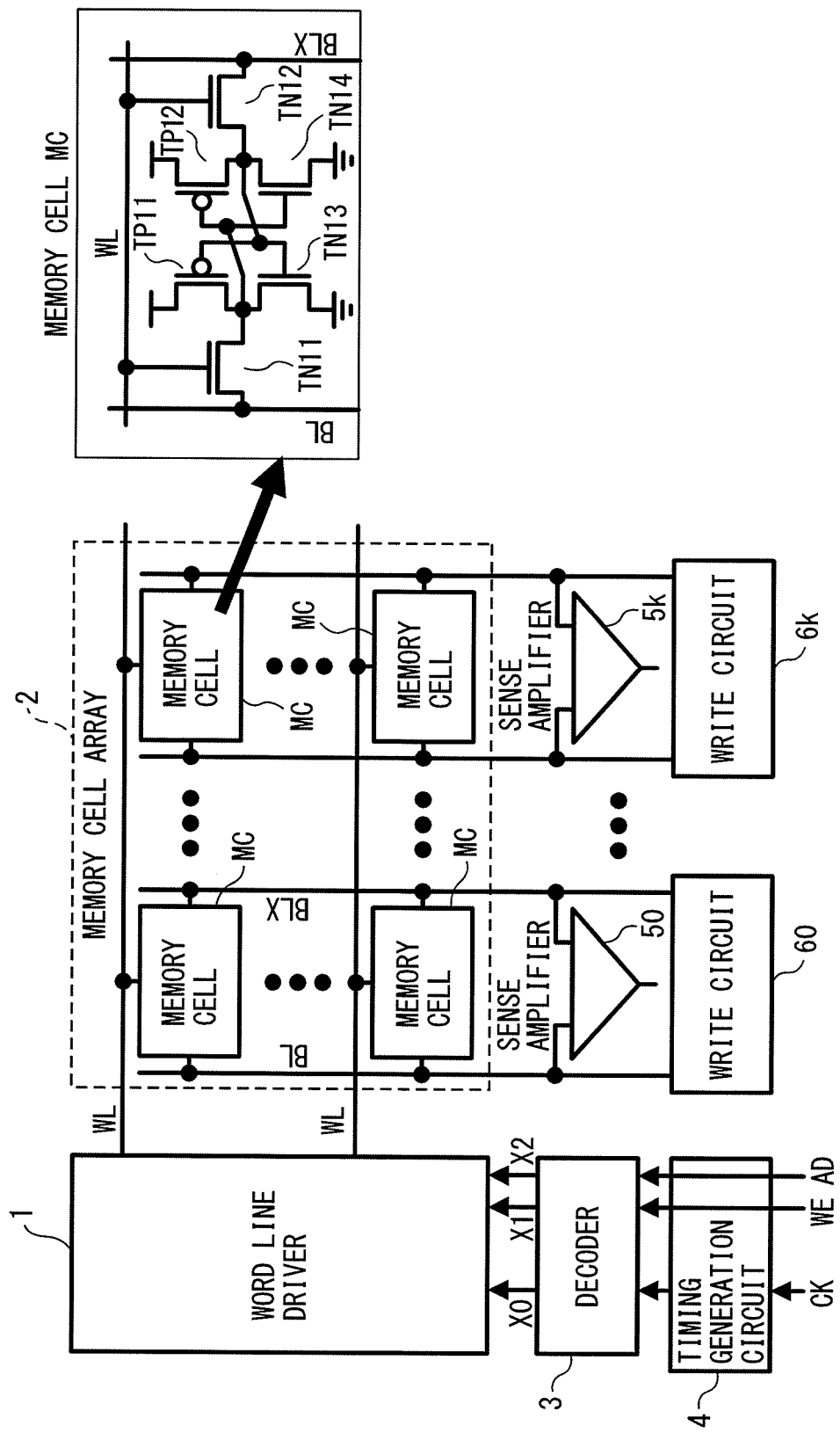
FIG. 1 is a block diagram illustrating one example of a semiconductor storage device.

First, before describing embodiments of a semiconductor device and a semiconductor storage device, an example of the semiconductor storage device and problems in the semiconductor storage device will be described below, with reference to FIG. 1 to FIG. 8. FIG. 1 is a bock diagram illustrating one example of the semiconductor storage device and illustrates one example of an SRAM.

In FIG. 1, 1 represents a word line driver, 2 represents a memory cell array, 3 represents a decoder, 4 represents a timing generation circuit, 50, 51, . . . , 5k (50 to 5k) represent sense amplifiers, and 60, 61, . . . , 6k (60 to 6k) represent write circuits. Further, the reference signs MC, WL, and BL and BLX represent a memory cell (SRAM cell), a word line, and complementary (differential) bit lines, respectively.

As illustrated in FIG. 1, the SRAM includes a word line driver 1, a memory cell array 2, a decoder 3, a timing generation circuit 4, sense amplifiers 50 to 5k, and write circuits 60 to 6k. The memory cell array 2 includes a plurality of memory cells MC disposed in a matrix form each connected to the word line WL and the bit lines BL and BLX.

Each memory cell MC includes six transistors including, for example, p-channel type MOS (pMOS) transistors TP11 and TP 12 and n-channel type MOS (nMOS) transistors TN11 to TN14. The memory cell MC is not limited to those including six transistors and may be memory cells (SRAM cells) having various well-known configurations.

The timing generation circuit 4 receives, for example, a clock signal CK, a write enable signal WE, and an address signal AD and generates various types of timing signals.

The decoder 3 receives, for example, a write enable signal WE and an address signal AD, outputs decode signals X0 to X2 to the word line driver 1, and the word line driver 1 selects a predetermined word line WL corresponding to the decode signals X0 to X2.

The sense amplifiers 51 to 5k are disposed for the complementary bit lines BL and BLX corresponding to each amplifier, and read and output data from the memory cell MC corresponding to the word line WL selected by the word line driver 1 during read operation.

The write circuits 61 to 6k are disposed for the complementary bit lines BL and BLX corresponding to each circuit, and write given data in the memory cell MC corresponding to the word line WL selected by the word line driver 1 during write operation.

In the semiconductor storage device (SRAM) illustrated in FIG. 1, leakage current flowing in the word line driver 1 is very large and accounts for most of a leakage current of an SRAM macro, for example. FIG. 1 illustrates merely an example regarding not only a configuration of the memory cell MC but also other configurations, and needless to say, various modifications and changes can be made.

Figure 2:
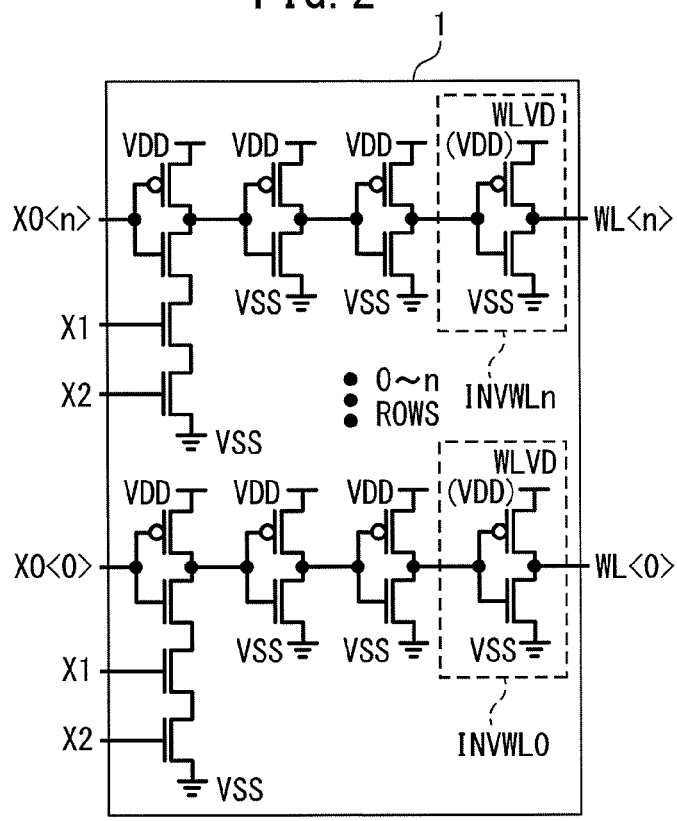
FIG. 2 is a circuit diagram illustrating one example of a word line driver in the semiconductor storage device illustrated in FIG. 1.

FIG. 2 is a circuit diagram illustrating one example of the word line driver in the semiconductor storage device illustrated in FIG. 1. As illustrated in FIG. 2, in the word line driver 1 in the SRAM of FIG. 1, final stage inverters INVWL0 to INVWLn drive, for example, word lines WL<0> to WL<n>, respectively, each connected with a large number of memory cells MC.

In the following description, the reference sign VDD represents a high-potential power supply line or a voltage of the high-potential power supply line (a high-potential power supply voltage) as appropriate, and the reference sign VSS represents a low-potential power supply line or a voltage of the low-potential power supply line (a low-potential power supply voltage) as appropriate.

Therefore, transistors of the final stage inverters INVWL0 to INVWLn are designed as ones that are large in size to increase drive capability. In other words, for the final stage inverters INVWL0 to INVWLn, large-size transistors are used and therefore, a leakage current of each final stage inverter also increases.

Further, the word line driver 1 includes, for example, n+1 final stage inverters INVWL0 to INVWLn disposed on the row side to drive n+1 word lines WL<0> to WL<n>. As a result, leakage currents (leakage powers) of the final stage inverters INVWL0 to INVWLn become very large and account for at least 90% of a leakage current of the word line driver 1, for example.

The word line driver in the semiconductor storage device illustrated in FIG. 1 may include, for example, a plurality of the word line drivers (word line driver blocks) 1 illustrated in FIG. 2.

In the word line driver 1 illustrated in FIG. 2, the word line driver itself includes neither a normal operation mode (selection) nor a standby mode (non-selection), but selects a word line merely in accordance with the decode signals X0 to X2 from the decoder 3. In other words, note that selection/non-selection of the word line driver itself and a selection operation for a word line executed by the word line driver are different.

Figure 3:
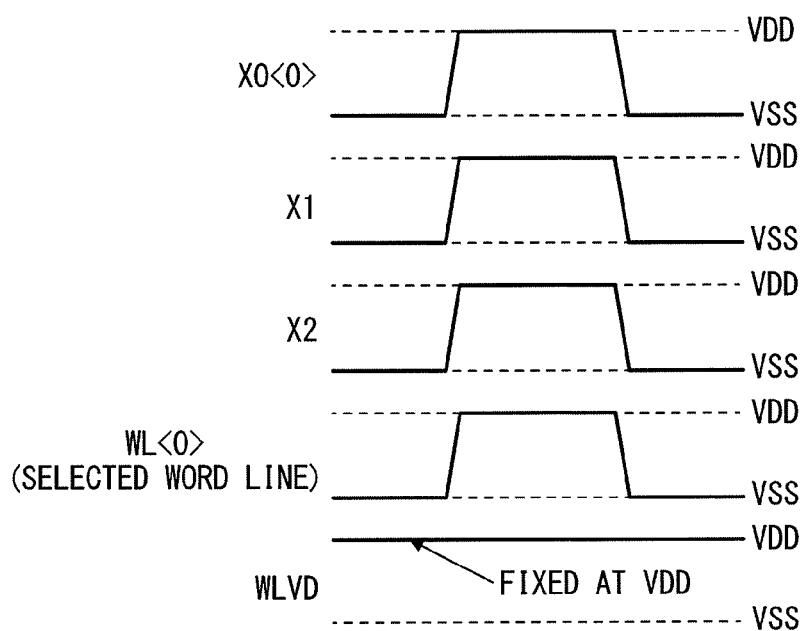
FIG. 3 is a timing diagram for describing an operation of the word line driver illustrated in FIG. 2.

FIG. 3 is a timing diagram for describing an operation of the word line driver illustrated in FIG. 2, and illustrates a case where when, for example, decode signals X0<0>, X1, and X2 from the decoder 3 are at a high level "H: VDD," the word line WL<0> is selected (VDD: "H").

When this word line WL<0> is selected (VDD: "H"), for example, decode signals X0<1> to X0<n> are caused to be at a low level "L: VSS" and then all of the word lines WL<1> to WL<n> become in a non-selection (VSS: "L") state. In other words, according to a level of the decode signals X0 (X0<0> to X0<n>), X1 from the decoder 3, and X2, any one of a plurality of word lines WL<0> to WL<n> is selected to be at VDD.

In FIG. 3, a power supply voltage (a source voltage of a pMOS transistor) of the final stage inverters INVWL0 to INVWLn is fixed at a voltage VDD of the high-potential power supply line of the SRAM. In other words, as described above, the word line driver 1 includes neither the normal operation mode (selection) nor the standby mode (non-selection).

A ground voltage (a source voltage of an nMOS transistor) of the final stage inverters INVWL0 to INVWLn and a low level "L" of the decode signals X0 to X2 are assumed to be a low-potential power supply voltage VSS of the SRAM.

Figure 4:
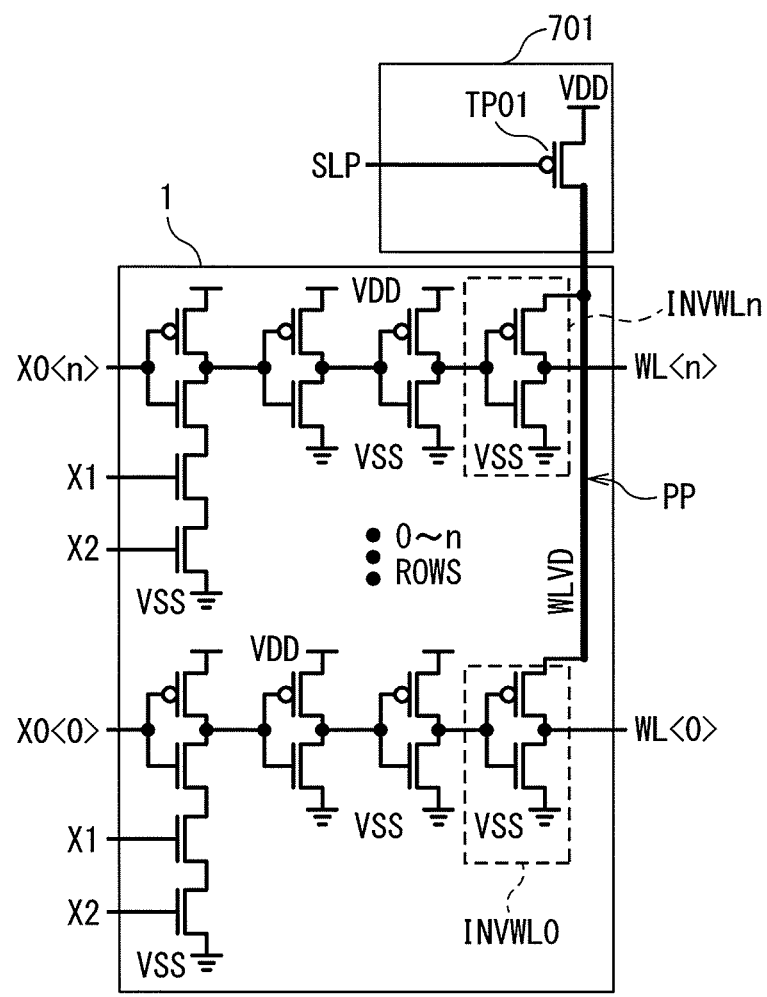
FIG. 4 is a circuit diagram illustrating another example of the word line driver in the semiconductor storage device illustrated in FIG. 1.
Figure 5:
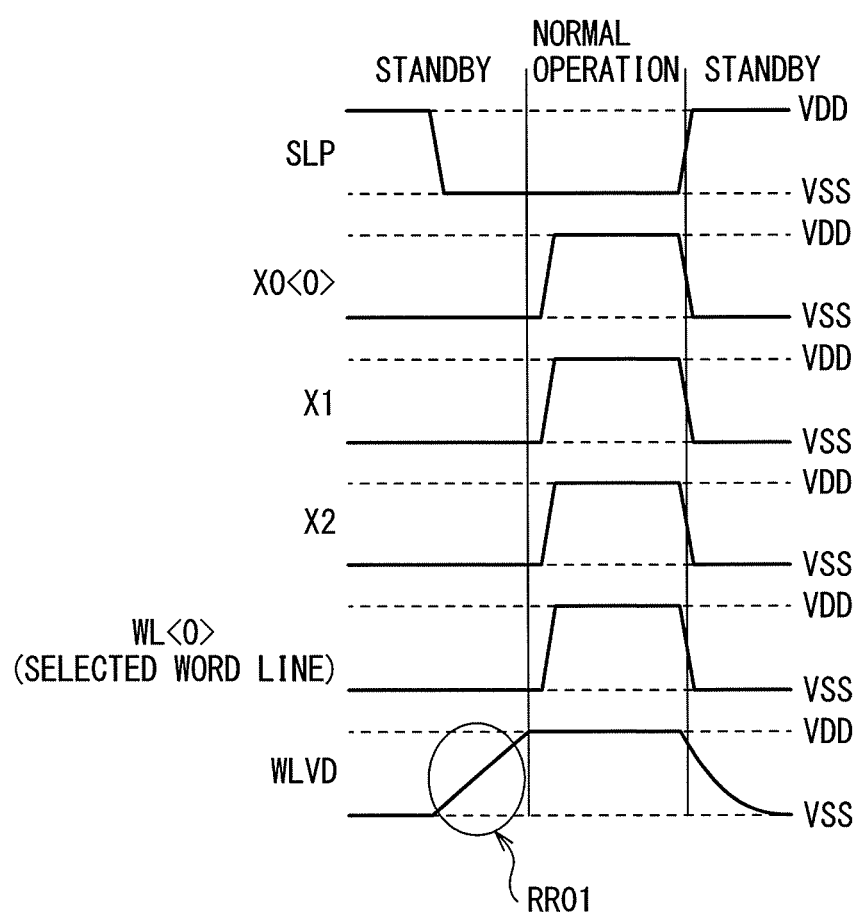
FIG. 5 is a timing diagram for describing an operation of the word line driver illustrated in FIG. 4.

FIG. 4 is a circuit diagram illustrating another example of the word line driver in the semiconductor storage device illustrated in FIG. 1, and FIG. 5 is a timing diagram for describing an operation of the word line driver illustrated in FIG. 4.

The word line driver (word line driver block) 1 illustrated in FIG. 4 includes a leakage current control circuit 701 between a power supply line PP feeding a power supply voltage WLVD of the final stage inverters INVWL0 to INVWLn and a high-potential power supply line VDD.

The leakage current control circuit 701 includes a pMOS transistor TP01 where a control signal SLP is input to the gate; and is switched on when the control signal SLP is at "L" (VSS) and is switched off when the control signal SLP is at "H" (VDD).

In other words, as illustrated in FIG. 4 and FIG. 5, when the word line driver 1 is in the standby mode (standby: non-selection), the control signal SLP is caused to be at VDD("H") and the transistor TP01 is switched off to block leakage current resulting from the final stage inverters INVWL0 to INVWLn.

Then, when the word line driver 1 is switched from the standby mode to the normal operation mode (normal operation: selection), for example, when the decode signals X0<0>, X1, and X2 become "H" and the word line WL<0> is selected, the control signal SLP is lowered from VDD to VSS.

This control signal SLP is lowered from VDD to VSS and thereby, the pMOS transistor TP01 is switched on and then the high-potential power supply voltage VDD is applied to the power supply line PP as a power supply voltage WLVD of the final stage inverter via the transistor TP01.

In other words, an ON operation of the transistor TP01 raises a potential of the power supply line PP from the low-potential power supply voltage VSS to the high-potential power supply voltage VDD, and the power supply voltage WLVD of the final stage inverters INVWL0 to INVWLn becomes VDD.

A potential of the power supply line PP is gradually changed from the previous VSS to VDD (refer to RR01 in FIG. 5) after the transistor TP01 is switched on and therefore, the control signal SLP needs to be controlled, for example, to be at "L" before the normal operation mode is started.

When the normal operation mode is ended and then switched to the standby mode, the control signal SLP is raised from "L" to "H" and thereby, the power supply voltage WLVD of the final stage inverter is changed from VDD to VSS and then leakage current in the standby mode is blocked.

As illustrated by RR01 of FIG. 5 described above, even when, for example, the control signal SLP is lowered from "H" to "L" for switching from the standby mode to the normal operation mode, the power supply voltage WLVD of the final stage inverter is not immediately changed up to VDD. This results from, for example, the presence of a large parasitic capacitance in the power supply line PP feeding WLVD.

Therefore, to execute a read or write operation immediately after switching from the standby mode to the normal operation mode, a dedicated control circuit is necessary for causing the control signal SLP to lower from "H" to "L" before the normal operation mode is started.

However, in an SRAM or the like that needs to operate at high speed, it is difficult to change the control single SLP by predicting an access in advance and further, the normal operation mode is started after WLVD is changed to VDD, resulting in a delay.

In this manner, the word line driver illustrated in FIG. 4 takes a long time upon return (switch) from the standby mode to the normal operation mode and therefore, it is difficult to apply the word line driver in cases other than a case of causing the SRAM not to operate for a long period of time.

Figure 6:
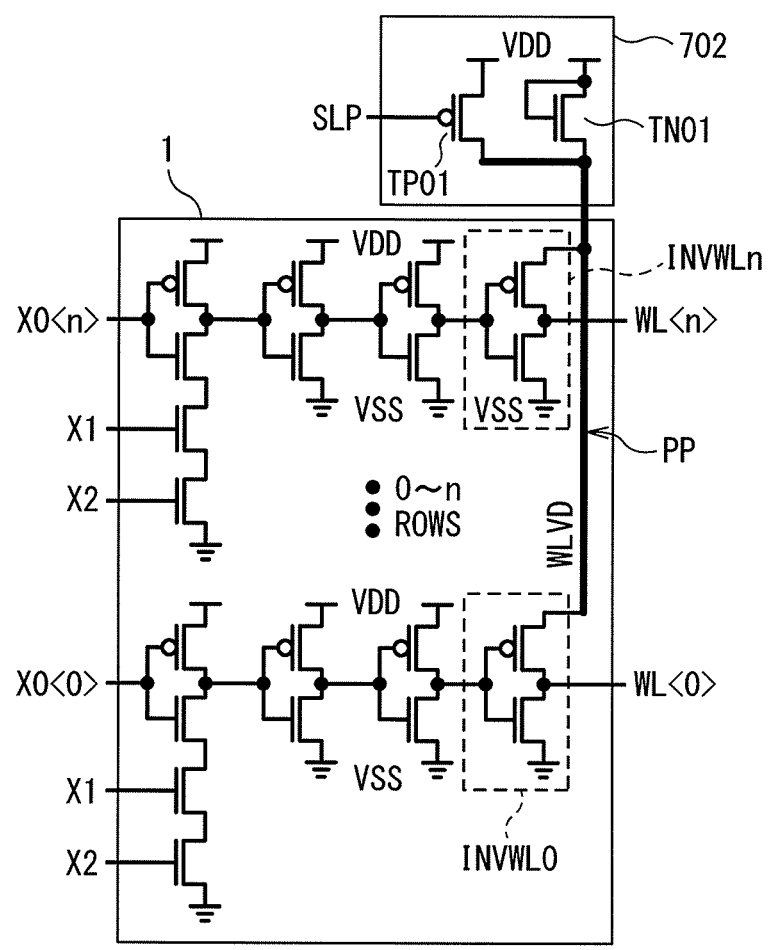
FIG. 6 is a circuit diagram illustrating further another example of the word line driver in the semiconductor storage device illustrated in FIG. 1.
Figure 7:
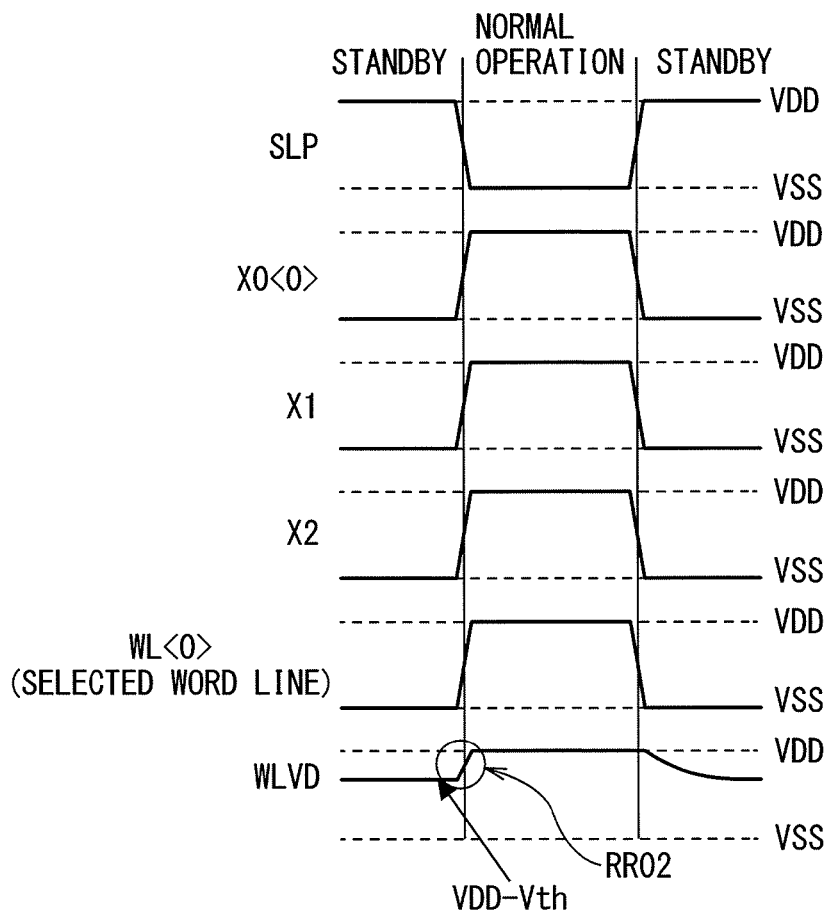
FIG. 7 is a timing diagram for describing an operation of the word line driver illustrated in FIG. 6.

FIG. 6 is a circuit diagram illustrating further another example of the word line driver in the semiconductor storage device illustrated in FIG. 1, and FIG. 7 is a timing diagram for describing an operation of the word line driver illustrated in FIG. 6.

The word line driver illustrated in FIG. 6 shortens, for example, a time when the standby mode returns to the normal operation mode, and a diode (diode-connected nMOS transistor) TN01 is disposed in parallel to the transistor TP01 in FIG. 4.

As is obvious from a comparison between FIG. 7 and FIG. 5 described above, the word line driver illustrated in FIG. 6 makes it possible to shorten the portion of RR01 taking long time in FIG. 5 as seen in RR02 in FIG. 7.

However, in the word line driver illustrated in FIG. 6, the power supply voltage WLVD of the final stage inverter of the standby mode decreases down to not VSS but only VDD-Vth since the transistor (diode) TN01 is provided. Therefore, even in the standby mode, leakage current flows to some extent due to the final stage inverter. Vth represents a threshold voltage of the transistor TN01.

Figure 8:
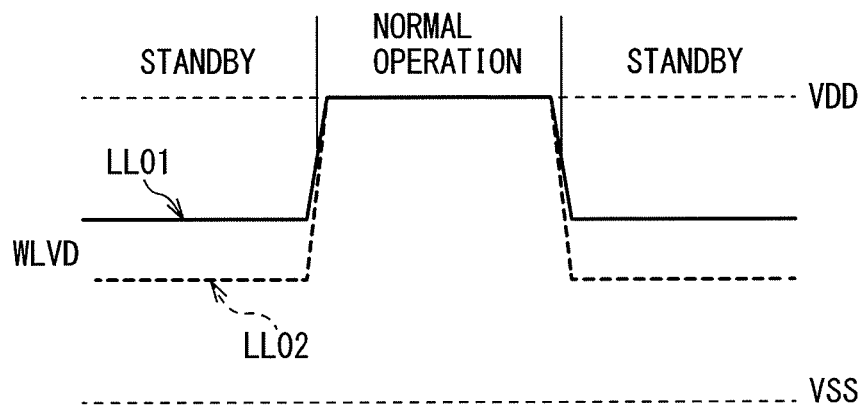
FIG. 8 is a diagram for describing an operation of the word line driver illustrated in FIG. 6.

FIG. 8 is a diagram for describing an operation of the word line driver illustrated in FIG. 6. In a semiconductor device, a delay of a circuit varies, for example, due to a process (a variation in manufacturing). In FIG. 8, the reference signs LL01 and LL02 represent a characteristic of a highest-speed operation condition (Fast Corner) and a characteristic of a lowest-speed operation condition (Slow Corner) according to the process, respectively.

As illustrated by LL01 of FIG. 8, in a process fast corner where, for example, a large amount of leakage current of the final stage inverter flows, a threshold voltage Vth of the transistor TN01 is low and therefore, the power supply voltage WLVD of the final stage inverter does not decrease much, resulting in a small effect for leakage current reduction.

In other words, in the process fast corner where, for example, an amount of leakage current of the final stage inverter is large, and therefore it is difficult to decrease the power supply voltage WLVD of the final stage inverter to a large extent to sufficiently reduce leakage current.

On the other hand, as illustrated by LL02 of FIG. 8, in a process slow corner where, for example, an amount of leakage current of the final stage inverter is small and transistor performance is poor, a threshold voltage Vth of the transistor TN01 is high and therefore, the power supply voltage WLVD of the final stage inverter decreases to a large extent. Therefore, a return from the standby mode to the normal operation mode is delayed.

In other words, in the process slow corner where, for example, an amount of leakage current of the final stage inverter is small, the power supply voltage WLVD of the final stage inverter decreases to a large extent and therefore, a return from the standby mode to the normal operation mode is delayed.

In this manner, it is difficult for the word line driver illustrated in FIG. 6 to set, for example, the power supply voltage WLVD of the final stage inverter at an optimal voltage level for each process corner.

Figure 9:
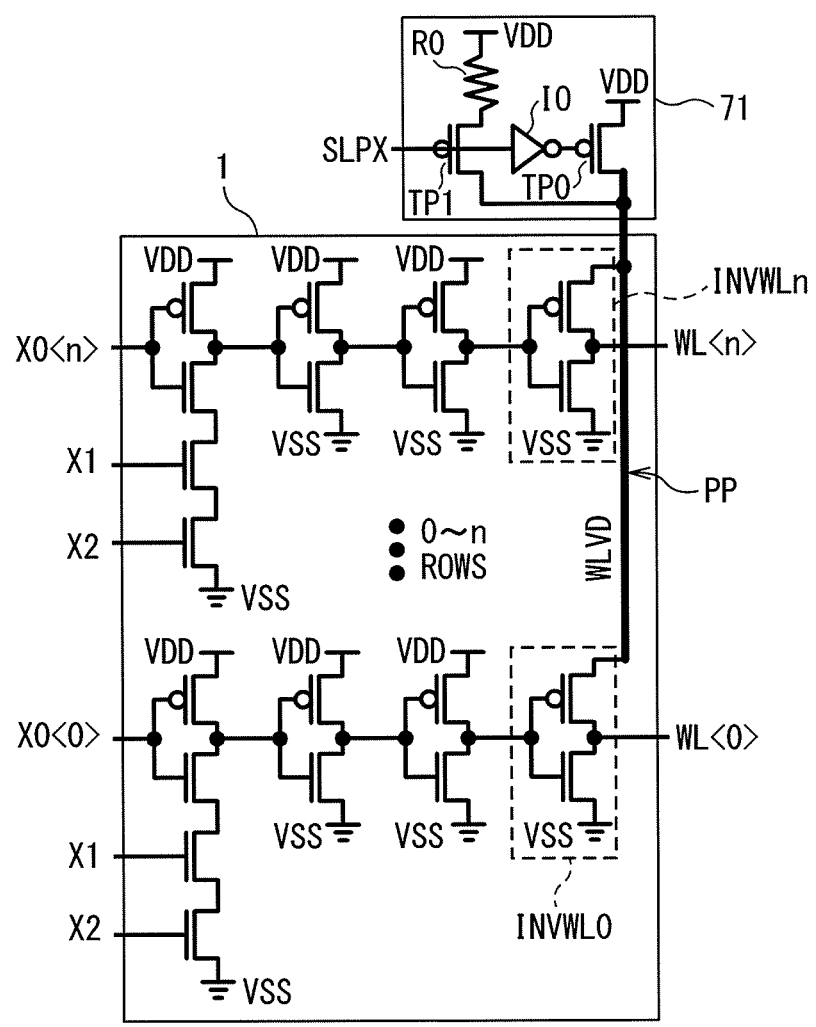
FIG. 9 is a circuit diagram illustrating one example of a word line driver in a first embodiment of the semiconductor storage device.

The embodiments of the semiconductor device and the semiconductor storage device will now be described in detail with reference to the accompanying drawings. FIG. 9 is a circuit diagram illustrating one example of a word line driver in a first embodiment of the semiconductor storage device.

The word line driver illustrated in FIG. 9 is applicable as the word line driver 1 of the semiconductor storage device (SRAM) described with reference to FIG. 1. Further, it is also possible that a plurality of the word line drivers illustrated in FIG. 9 are provided as word line driver blocks (circuit blocks) and the plurality of word line driver blocks are applied as the word line driver 1 in FIG. 1.

Further, the present embodiment to be described in detail below is applied to an SRAM without limitation and is applicable to various semiconductor storage devices including, for example, a DRAM. Further, the present embodiment is widely applicable to various semiconductor devices including, for example, a circuit block where the normal operation mode (selection) and the standby mode (non-selection) are switchable.

As is obvious from comparisons between FIG. 9 and FIG. 2, FIG. 4, and FIG. 6 described above, in the first embodiment illustrated in FIG. 9, the configuration of the word line driver (word line driver block) 1 is the same as those of FIG. 2, FIG. 4, and FIG. 6, and the configuration of a leakage current control circuit 71 is different.

As illustrated in FIG. 9, the leakage current control circuit 71 is disposed between the high-potential power supply line (a first power supply line: VDD) and the power supply line (a first local line) PP of a plurality (n+1) of final stage inverters INVWL0 to INVWLn driving the word lines WL<0> to WL<n>, respectively.

The power supply line PP is connected to the source of a pMOS transistor in each of the final stage inverters INVWL0 to INVWLn, and the leakage current control circuit 71 controls a voltage level of the power supply line PP in the normal operation mode and the standby mode.

The source (a second local line) of an nMOS transistor in each of the final stage inverters INVWL0 to INVWLn is connected to the low-potential power supply line (a second power supply line: VSS) fed with the low-potential power supply voltage VSS.

The leakage current control circuit 71 includes two pMOS transistors TP0 and TP1, a resistor device (a first resistor device) R0, and an inverter I0. The transistor (a first transistor) TP0 is disposed between the high-potential power supply line (VDD) and the power supply line PP, and a signal (SLP) where a control signal SLPX is inverted by the inverter I0 is input to the gate of the transistor. SLPX represents an inverted logic signal of SLP.

The transistor (a second transistor) TP1 is connected in series to the resistor device R0 and disposed between the high-potential power supply line (VDD) and the power supply line PP. The resistor device R0 is disposed on the high-potential power supply line (VDD) side, and the transistor TP1 is disposed on the power supply line PP side.

In other words, one end of the resistor device R0 is connected to the high-potential power supply line (VDD), and the other end of the resistor device R0 is connected to the source of the transistor TP1. The drain of the transistor TP1 is connected to the power line PP, and the control signal SLPX is input to the gate of the transistor TP1.

The reason why the transistors TP0 and TP1 and the resistor device R0 are disposed between the high-potential power supply line (VDD) and the power supply line PP is that when the word line WL is selected, each of the final stage inverters INVWL0 to INVWLn outputs the high-potential power supply voltage VDD.

Figure 10:
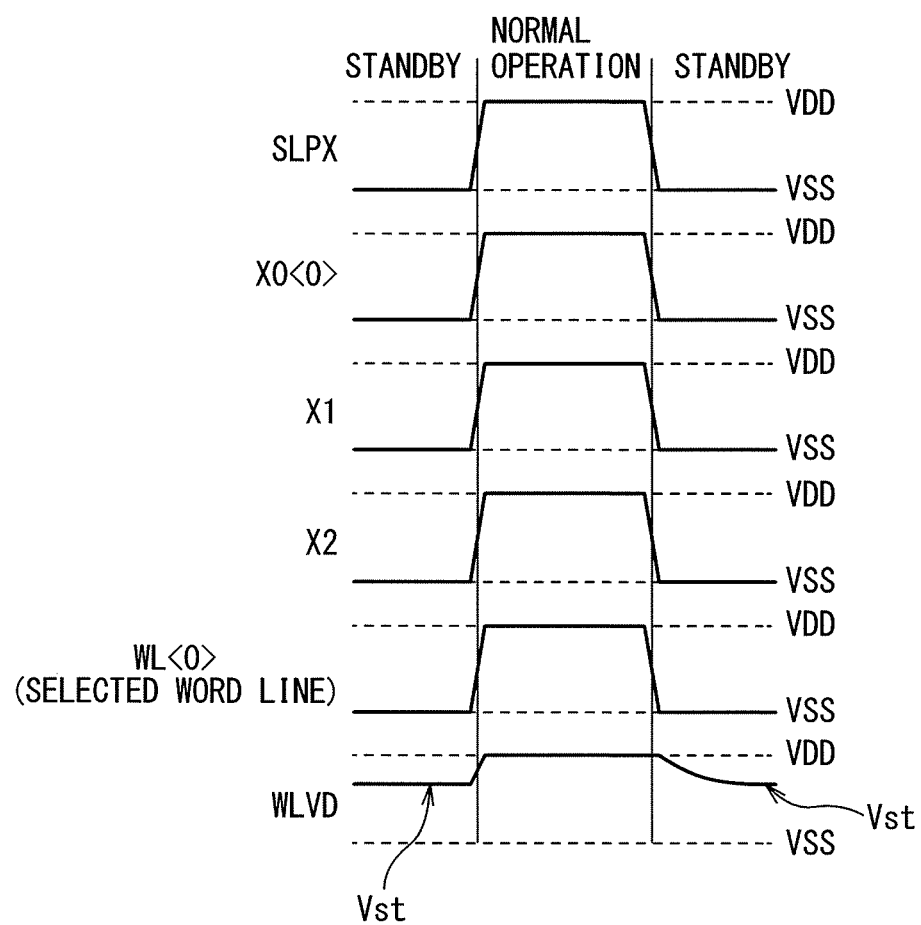
FIG. 10 is a timing diagram for describing an operation of the word line driver illustrated in FIG. 9.

FIG. 10 is a timing diagram for describing an operation of the word line driver illustrated in FIG. 9 and illustrates a case where when, for example, the decode signals X0<0>, X1, and X2 from the decoder 3 are at the high level "H: VDD," the word line WL<0> is selected (VDD: "H").

When this word line WL<0> is selected (VDD: "H"), for example, decode signals X0<1> to X0<n> are caused to be at the low level "L: VSS" and then all of the word lines WL<1> to WL<n> become in the non-selection (VSS: "L") state. In other words, according to a level of the decode signals X0 (X0<0> to X0<n>), X1, and X2 from the decoder 3, any one of a plurality of word lines WL<0> to WL<n> is selected to be at VDD.

As illustrated in FIG. 9 and FIG. 10, in the normal operation mode, the control signal SLPX is caused to be at "H" (VDD), and then the transistor TP0 is switched on and the transistor TP1 is switched off to apply a high-potential power supply voltage VDD via the transistor TP0 to the power supply line PP. Thereby, the power supply voltage WLVD of the final stage inverters INVWL0 to INVWLn in the word line driver 1 caused to be in the normal operation mode (selected) becomes the high-potential power supply voltage VDD.

On the other hand, in the standby mode, the control signal SLPX is caused to be at "L" (VSS), and then the transistor TP0 is switched off and the transistor TP1 is switched on to apply a standby voltage Vst via the resistor device R0 and the transistor TP1 to the power supply line PP. Thereby, the power supply voltage WLVD of the final stage inverters INVWL0 to INVWLn in the word line driver 1 caused to be in the standby mode (non-selected) becomes the standby voltage Vst.

Figure 11:
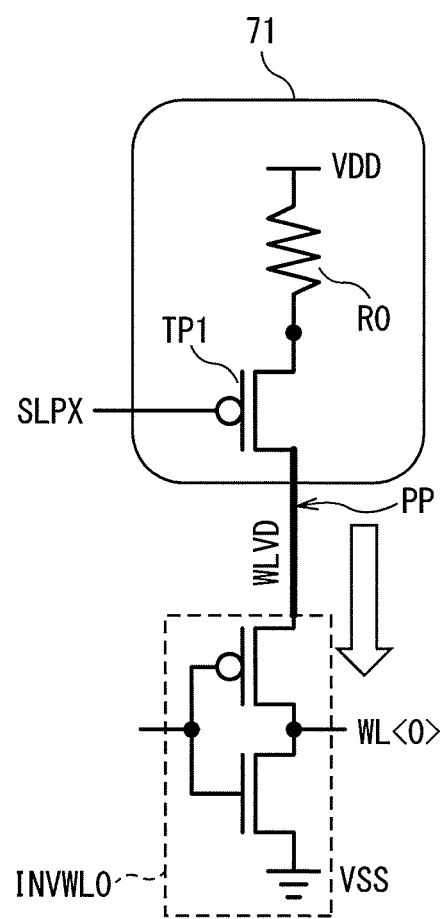
FIG. 11 is a diagram for describing a leakage current control circuit in the word line driver illustrated in FIG. 9.

FIG. 11 is a diagram for describing the leakage current control circuit in the word line driver illustrated in FIG. 9, and for describing the leakage current control circuit 71 in the standby mode (non-selection).

As illustrated in FIG. 11, in the standby mode, for the power supply line PP (power supply voltage WLVD) of the final stage inverters INVWL0 to INVWLn, the standby voltage Vst via the resistor device R0 and the transistor TP1 is applied.

The resistor device R0 is assumed to be a resistor device such as a silicide resistor device, or a poly silicide resistor device, having a characteristic where a resistance value thereof increases with an increase in temperature. The poly silicide resistor device may also be expressed as a silicide poly resistor device.

Silicide resistance is generally defined for a non-silicide resistor device where a resistance value thereof does not change substantially for temperature changes. Therefore, the resistor device R0 of the present embodiment is not limited to a silicide resistor device (a poly silicide resistor device) when being a resistor device having a characteristic where a resistance value thereof increases with an increase in temperature.

Figure 12:
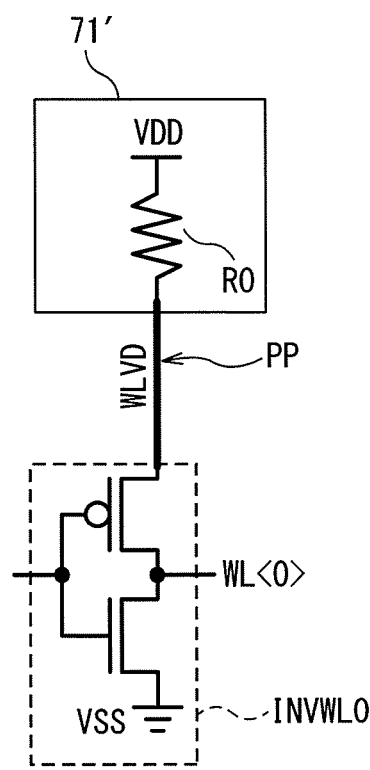
FIG. 12 is a diagram for describing a modified example of the leakage current control circuit illustrated in FIG. 11.

FIG. 12 is a diagram for describing a modified example of the leakage current control circuit illustrated in FIG. 11. As is obvious from a comparison between FIG. 12 and FIG. 11, in the modified example illustrated in FIG. 12, a leakage current control circuit 71' includes only the resistor device (the first resistor device) R0 without the pMOS transistor TP1.

In other words, the resistor device R0 is connected to the high-potential power supply line (VDD) and the power supply line PP of the final stage inverter regardless of the normal operation mode or the standby mode. In the normal operation mode, a voltage (WLVD) of the power supply line PP becomes the high-potential power supply voltage VDD when the transistor TP0 is switched on, and becomes the standby voltage Vst resulting from the resistor device R0 in the standby mode.

Also in the leakage current control circuit 71' of the modified example illustrated in FIG. 12, the resistor device R0 is assumed to be a resistor device such as a silicide resistor device, or a poly silicide resistor device, having a characteristic where a resistance value thereof increases with an increase in temperature.

When the leakage current control circuit 71' illustrated in FIG. 12 is applied, in other words, when the standby voltage Vst is generated only by the poly silicide resistor device R0, for example, a very large area is allocated for forming a poly silicide resistor device.

In contrast, when the leakage current control circuit 71 illustrated in FIG. 11 (FIG. 9) is applied, in other words, when the standby voltage Vst is generated by the transistor TP1 and the poly silicide resistor device R0, an occupied area of the poly silicide resistor device is reducible. In this case, it is preferable to connect the poly silicide resistor device R0 to the high-potential power supply line (VDD) side and to connect the pMOS transistor TP1 to the power supply line PP side of the final stage inverter.

In other words, when the leakage current control circuit 71 illustrated in FIG. 11 is applied, a predetermined voltage drop (IR drop) is generated by the poly silicide resistor device R0 and a reverse bias is applied to the pMOS transistor TP1, resulting in an increase in the on-resistance of the transistor TP1. Thereby, when a leakage current control circuit is formed on a semiconductor chip, the occupied area is substantially reducible, compared with the case of use of only the poly silicide resistor device R0 of FIG. 12.

Specifically, a case is considered in which when, for example, the number of the final stage inverters INVWL0 to INVWLn connected to the power supply line PP is 64 (n=63), a level of the standby voltage Vst is decreased from the high-potential power supply voltage VDD by 10%.

At that time, when the leakage current control circuit 71 illustrated in FIG. 11 is applied, a resistance value of the poly silicide resistor device R0 may be about 250Ω and a gate width (W) of the transistor TP1 may be about one twelfth of a pMOS transistor gate width of each final stage inverter (e.g., INVWL0).

In contrast, when the leakage current control circuit 71' illustrated in FIG. 12 is applied, a resistance value of the poly silicide resistor device R0 needs to be about ten times the resistance value in the leakage current control circuit 71 described above, in other words, about 2500Ω, which is very large.

In this manner, when the leakage current control circuit 71' illustrated in FIG. 12 is applied, an area overhead for forming the poly silicide resistor device R0 on a semiconductor chip is increased, and therefore the leakage current control circuit 71 illustrated in FIG. 11 is preferably applied.

FIG. 13A and FIG. 13B are diagrams for describing an operation of the word line driver illustrated in FIG. 9, and illustrates an operation of the word line driver in the semiconductor storage device of the first embodiment together with the word line driver (comparative example) described with reference to FIG. 6 and FIG. 8. FIG. 13A illustrates an operation of a process fast corner, and FIG. 13B illustrates an operation of a process slow corner.

In FIG. 13A, the reference sign LL01 corresponds to LL01 of FIG. 8 described above and represents an operation of a process fast corner by a leakage current control circuit 702 illustrated in FIG. 6, and the reference sign LL1 represents an operation of a process fast corner by the leakage current control circuit 71 illustrated in FIG. 9.

Further, in FIG. 13B, the reference sign LL02 corresponds to LL02 of FIG. 8 described above and represents an operation of a process slow corner by the leakage current control circuit 702 illustrated in FIG. 6, and the reference sign LL2 represents an operation of a process slow corner by the leakage current control circuit 71 illustrated in FIG. 9.

Initially, as illustrated by the characteristic curve LL01 in the process fast corner illustrated in FIG. 13A, according to the leakage current control circuit 702 (comparative example) illustrated in FIG. 6, a threshold voltage Vth of the transistor TN01 is low and therefore, WLVD does not decrease much, resulting in a small effect for leakage current reduction.

In contrast, as illustrated by the characteristic curve LL1, according to the leakage current control circuit 71 of the first embodiment, much leakage current flows compared with the process slow corner and therefore, the power supply voltage WLVD of the final stage inverter decreases to a large extent due to an IR drop of the resistor device R0.

As a result, in the process fast corner, leakage current is substantially reduced. In the process fast corner, for example, high transistor performance is provided and a high-seed operation is possible and therefore, it does not take long time until a return even when a voltage value of the power supply voltage WLVD of the final stage inverter is low.

Next, as illustrated by the characteristic curve LL02 in the process slow corner illustrated in FIG. 13B, according to the leakage current control circuit 702 of the comparative example, the threshold voltage Vth of the transistor TN01 is high and the power supply voltage WLVD of the final stage inverter decreases to a large extent. Therefore, a return from the standby mode to the normal operation mode is delayed.

In other words, in the process slow corner, for example, transistor performance is poor and a high-speed operation is difficult and therefore, it takes long time until a return when a voltage value of the power supply voltage WLVD of the final stage inverter is low.

In contrast, as illustrated by the characteristic curve LL2, according to the leakage current control circuit 71 of the first embodiment, in the process slow corner, substantially no leakage current flows, and therefore the power supply voltage WLVD of the final stage inverter does not decrease substantially.

As a result, in the process slow corner, a return from the standby mode to the normal operation mode becomes fast. In the process slow corner where a return from the standby mode to the normal operation mode is fast, substantially no leakage current flows, and therefore leakage current is non-problematic even when the power supply voltage WLVD of the final stage inverter does not decrease much.

FIG. 14 is a table for describing the word line driver illustrated in FIG. 9 by comparison with the word line driver illustrated in FIG. 6, and organizes together the matters described with reference to FIG. 13A and FIG. 13B.

As is obvious from FIG. 14, in the process fast corner, according to the comparative example, the voltage level (WLVD) is high and a reduction effect for leakage current is small, but a return from the standby mode to the normal operation mode can be made quickly.

In contrast, according to the first embodiment, WLVD is low and therefore, an intended large reduction effect for leakage current is obtainable. Further, a return from the standby mode to the normal operation mode is relatively slow (that is average) compared with the comparative example, but in the process fast corner, a transistor operates at high speed inherently and therefore, a return operation does not become slow to the extent that a problem occurs.

In this manner, according to the first embodiment, in the process fact corner, a return from the standby mode to the normal operation mode is average, but a large reduction effect for leakage current is obtainable.

Next, in the process slow corner, according to the comparative example, WLVD is low, but a reduction effect for leakage current is small and a return from the standby mode to the normal operation mode is slow. In other words, in the process slow corner, even when WLVD is decreased, it is difficult to obtain a large reduction effect for leakage current. Further, in the process slow corner, since a transistor does not operate at high speed, a return is preferably made as fast as possible, which is, however, difficult due to low WLVD.

In contrast, in the process slow corner, according to the first embodiment, WLVD is high and substantially no reduction effect for leakage current is obtained, but a return from the standby mode to the normal operation mode can be made quickly (in a short period of time).

In this manner, according to the first embodiment, even a transistor difficult to be operated at high speed in response to the process slow corner has high WLVD and therefore, a return from the standby mode to the normal operation mode can be made quickly.

In this manner, according to the semiconductor storage device (semiconductor device) of the first embodiment, for example, as is obvious from the description with the comparative example, it is possible to control the voltage WLVD of the power supply line PP at an optimal voltage level with respect to each process corner of a transistor. As a result, it is possible to balance leakage current reduction and an increase in speed of a return from the standby mode to the normal operation mode.

An application of the present embodiment makes it possible not only to perform a return operation of the standby mode to the normal operation mode of the entire circuit but also to reduce leakage current in switching between a selected block and a non-selected block among a plurality of memory blocks in the semiconductor storage device, for example. Further, an application of the present embodiment also achieves the same possibility regarding leakage current reduction in switching between a selected operation circuit block and a non-selected stop circuit block in the semiconductor device.

As described with reference to FIG. 11 and FIG. 12 in the above description, it is preferable to apply a resistor device, as the resistor device R0, such as a silicide resistor device or a poly silicide resistor device, having a characteristic where a resistance value thereof increases with an increase in temperature.

The reason is that an increase in leakage current causes, for example, a temperature increase of a semiconductor chip and therefore, the temperature increase of the semiconductor chip causes a resistance value of the resistor device R0 to increase, and as a result, the resistor device R0 functions to further reduce leakage current.

Therefore, as the resistor device R0, it is preferable to apply, for example, a resistor device having a characteristic where a resistance value thereof increases with an increase in temperature as seen in a silicide resistor device, compared with a non-silicide resistor device where a resistance value thereof does not substantially change due to temperature changes.

Figure 15:
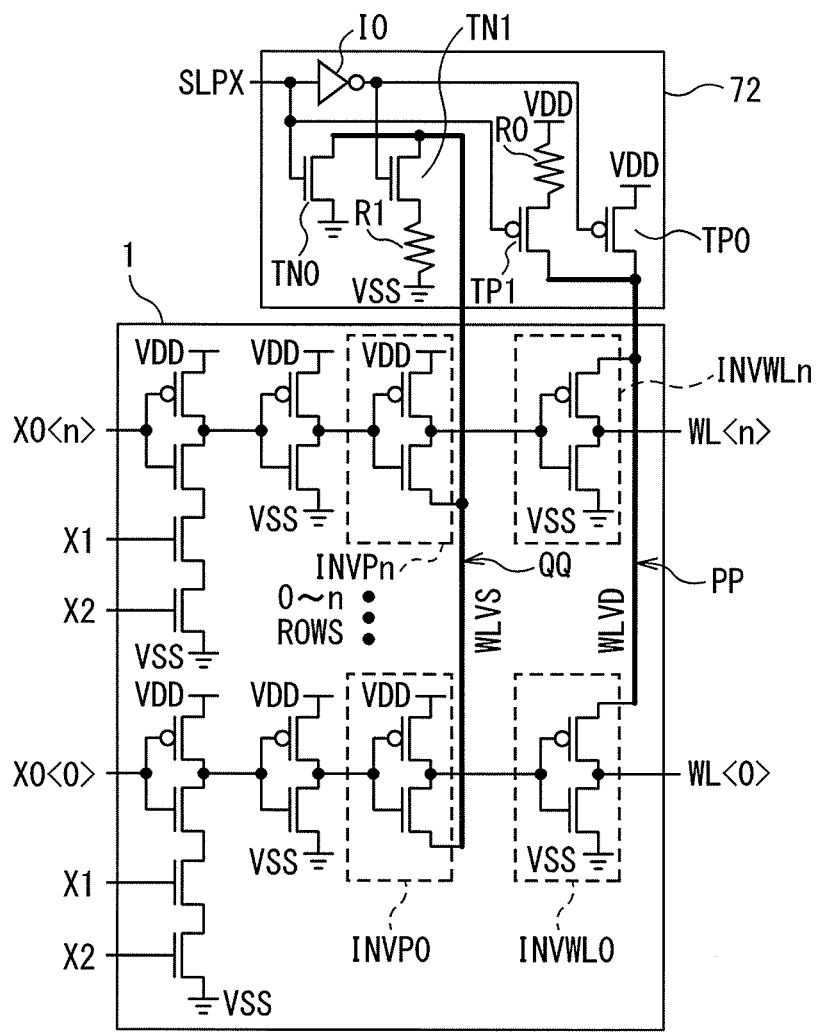
FIG. 15 is a circuit diagram illustrating one example of a word line driver in a second embodiment of the semiconductor storage device.

FIG. 15 is a circuit diagram illustrating one example of a word line driver in a second embodiment of the semiconductor storage device. As is obvious from a comparison between FIG. 15 and FIG. 9 described above, the semiconductor storage device of the second embodiment reduces leakage current also for preinverters INVP0 to INVPn disposed in a previous stage of the final stage inverters INVWL0 to INVWLn, respectively.

In other words, for example, the largest problem of consumed power (leakage current) in the standby mode is leakage current resulting from the final stage inverters INWL0 to INVWLn, but it is preferable to reduce also leakage current resulting from the preinverters INVP0 to INVPn disposed in the previous stage.

The preinverters INVP0 to INVPn drive the corresponding final stage inverters INWL0 to INVWLn, respectively, and a transistor size thereof is smaller than in the final stage inverters INWL0 to INVWLn driving the word lines WL<0> to WL<n> but is considerably large.

Therefore, the semiconductor storage device of the second embodiment reduces leakage current also for the preinverters INVP0 to INVPn disposed in the previous stage, in the same manner as in the final stage inverters INVWL0 to INVWLn.

As illustrated in FIG. 15, a leakage current control circuit 72 includes an nMOS transistor (a third transistor) TN0 disposed between the source (a third local line) QQ of an nMOS transistor in each of the preinverters INVP0 to INVPn and a low-potential power supply line (a second power supply line: VSS).

Further, the leakage current control circuit 72 includes a resistor device (a second resistor device) R1 and an nMOS transistor (a fourth transistor) TN1 connected in series between the third local line QQ and the low-potential power supply line (VSS). The source (a fourth local line) of a pMOS transistor in each of the preinverters INVP0 to INVPn is connected to a high-potential power supply line (VDD).

A control signal SLPX is input to the gate of the transistor TN0, and a signal (SLP) inverted from the control signal SLPX by an inverter I0 is input to the gate of the transistor TN1.

Therefore, when the first transistor TP0 disposed for the final stage inverters INVWL0 to INVWLn is switched on and the second transistor TP1 is switched off, the third transistor TN0 disposed for the preinverters INVP0 to INVPn is switched on and the fourth transistor TN1 is switched off.

The reason why the transistors TN0 and TN1 and the resistor device R1 are disposed between the low-potential power supply line (VSS) and the power supply line QQ is that when the word line WL is selected, each of the preinverters INVP0 to INVPn outputs a low-potential power supply voltage VSS.

Further, as described above, the reason why the transistors TP0 and TP1 and the resistor device R0 are disposed between the high-potential power supply line (VDD) and the power supply line PP is that when the word line WL is selected, each of the final stage inverters INVWL0 to INVWLn outputs a high-potential power supply voltage VDD.

Figure 16:
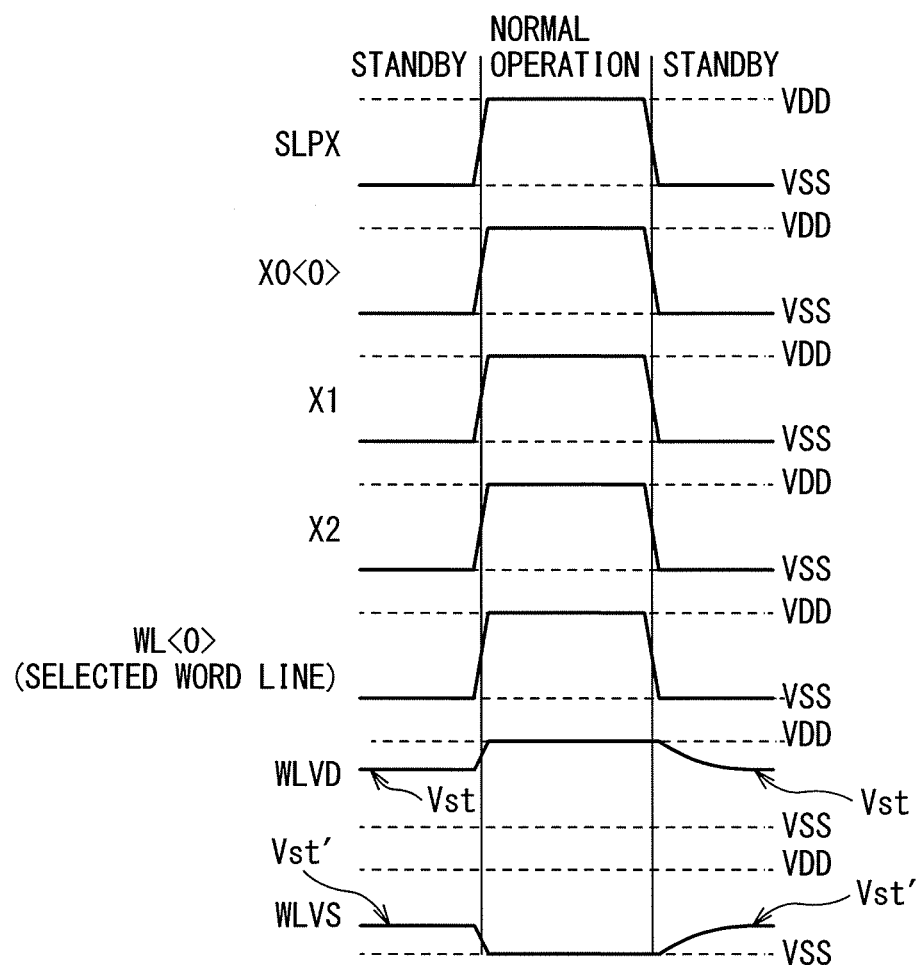
FIG. 16 a timing diagram for illustrating an operation of the word line driver illustrated in FIG. 15.

FIG. 16 is a timing diagram for describing an operation of the word line driver illustrated in FIG. 15. The reference sign WLVS represents a voltage of the third local line QQ in the preinverters INVP0 to INVPn. Further, the reference sign Vst' represents a voltage of the power supply line QQ of the preinverters INVP0 to INVPn in the standby mode, in other words, a standby voltage applied via the resistor device R1 and the transistor TN1.

As is obvious from a comparison between FIG. 16 and FIG. 10 described above, when, for example, decode signals X0<0>, X1, and X2 from the decoder 3 become at the high level "H: VDD," the word line WL<0> is selected (VDD: "H").

As illustrated in FIG. 15 and FIG. 16, in the normal operation mode, the control signal SLPX is caused to be at "H" (VDD), and then the transistors TP0 and TN0 are switched on and the transistors TP1 and TN1 are switched off.

Thereby, a high-potential power supply voltage VDD via the transistor TP0 is applied to the power supply line PP of the final stage inverters INVWL0 to INVWLn, and a low-potential power supply voltage VSS via the transistor TN0 is applied to the power supply line QQ of the preinverters INVP0 to INVPn.

On the other hand, in the standby mode, SLPX is caused to be at "L" (VSS), and then the transistor TP0 is switched off and the transistor TP1 is switched on to apply a standby voltage Vst via R0 and TP1 to the power supply line PP of the final stage inverters INVWL0 to INVWLn.

Further, in the standby mode, SLPX is caused to be at "L" (VSS), and then the transistor TN0 is switched off and the transistor TN1 is switched on to apply a standby voltage Vst' via R1 and TN1 to the power supply line QQ of the preinverters INVP0 to INVPn.

It is possible to reduce leakage current of the preinverters INVP0 to INVPn in the standby mode in the same manner as leakage current of the final stage inverters INVWL0 to INVWLn in the standby mode.

In other words, the semiconductor storage device of the second embodiment makes it possible to obtain a reduction effect for leakage current of the preinverters INVP0 to INVPn in the standby mode, in addition to a reduction effect for leakage current of the final stage inverters INVWL0 to INVWLn of the first embodiment.

The second resistor device R1 is also preferably formed with a resistor device such as a silicide resistor device or a poly silicide resistor device, having a characteristic where a resistance value thereof increases with an increase in temperature, in the same manner as the first resistor device R0 described above.

Figure 17:
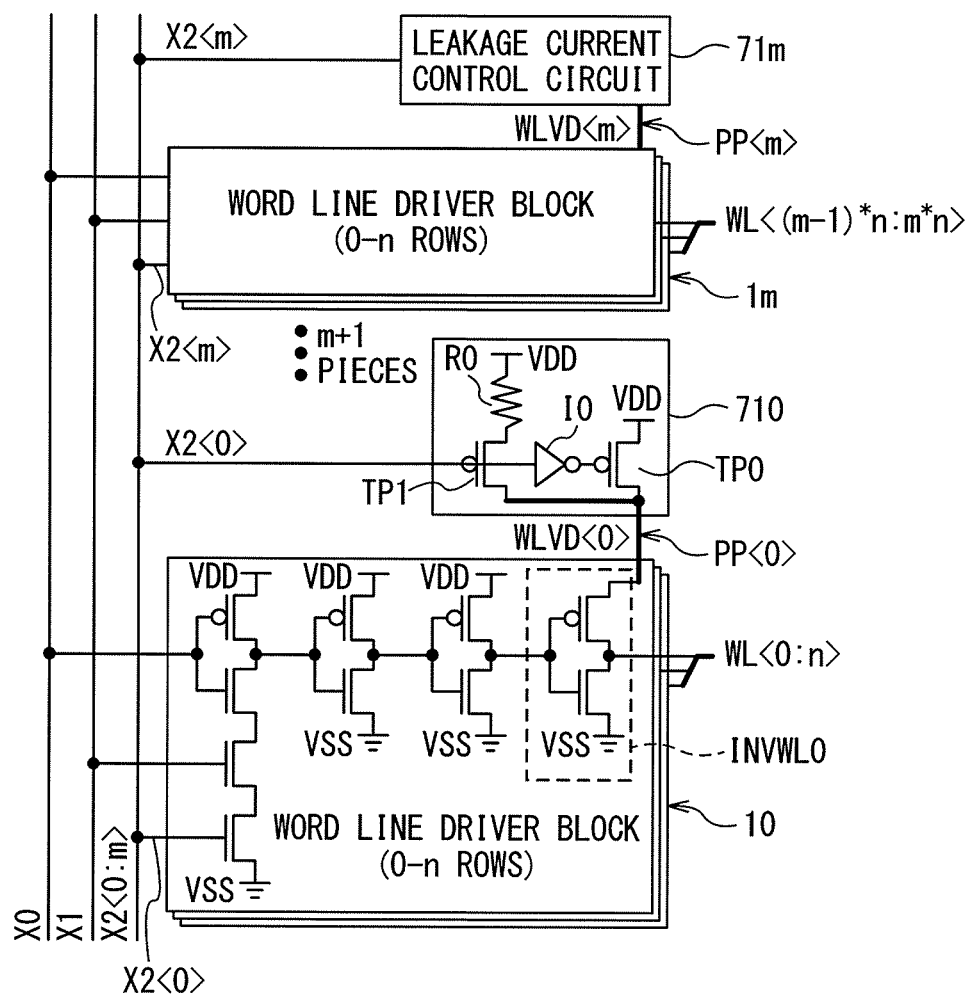
FIG. 17 is a block diagram illustrating the entire configuration of a word line driver in the semiconductor storage device applied with the first embodiment.
Figure 18:
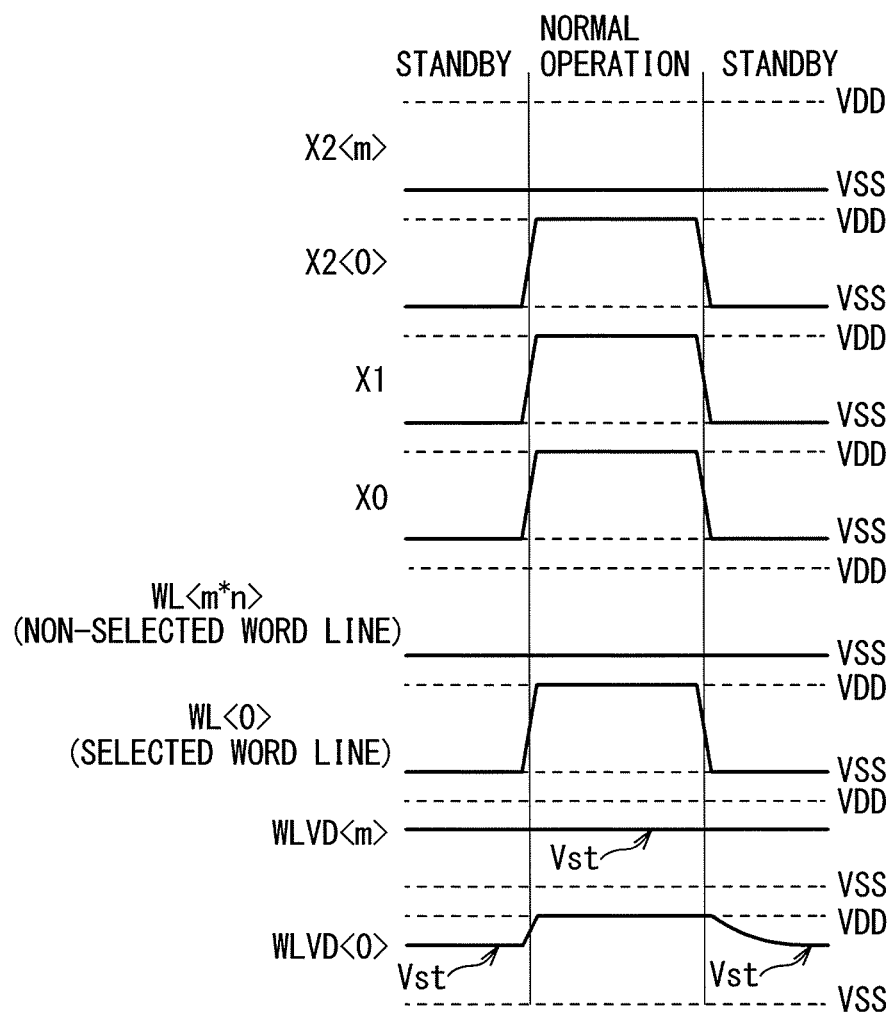
FIG. 18 is a timing diagram for describing an operation of the word line driver illustrated in FIG. 17.

FIG. 17 is a block diagram illustrating the entire configuration of a word line driver in the semiconductor storage device applied with the first embodiment, and FIG. 18 is a timing diagram for describing an operation of the word line driver illustrated in FIG. 17.

FIG. 17 is equivalent to one in which a word line driver includes a plurality of word line driver blocks 10 to 1m, and as leakage current control circuits 710 to 71m of the respective word line driver blocks, the leakage current control circuit 71 described with reference to FIG. 9 is applied.

As illustrated in FIG. 17, m+1 word line driver blocks 10 to 1m include the corresponding leakage current control circuits 710 to 71m, respectively. When, for example, the word line WL<0> is driven (selected), only the word line driver block 10 including WL<0> is caused to be in the normal operation mode and the other word line driver blocks 11 to 1m are caused to be in the standby mode (non-selection: stop).

In other words, the word line driver blocks 10 to 1m in FIG. 17 each correspond to the word line driver 1 in FIG. 9, and the leakage current control circuits 710 to 71m in FIG. 17 each correspond to the leakage current control circuit 71 in FIG. 9.

Further, power supply lines PP<0> to PP<m> of the respective word line driver blocks 10 to 1m in FIG. 17 each correspond to the power supply line PP of the word line driver 1 in FIG. 9, and voltages WLVD<0> to WLVD<m> thereof each correspond to the voltage WLVD in FIG. 9.

In other words, as illustrated in FIG. 18, the voltage WLVD<0> of the power supply line PP<0> of the final stage inverter of the word line driver block 10 including the selected WL<0> is changed from the standby (non-selection) voltage Vst to the high-potential power supply voltage VDD by switching on the transistor TP0.

All of the voltages WLVD<1> to WLVD<m> of the respective power supply lines PP<1> to PP<m> in the word line driver blocks 11 to 1m other than the word line driver block 10 are held at the standby voltage Vst and then the above reduction effect for leakage current is produced.

Figure 19:
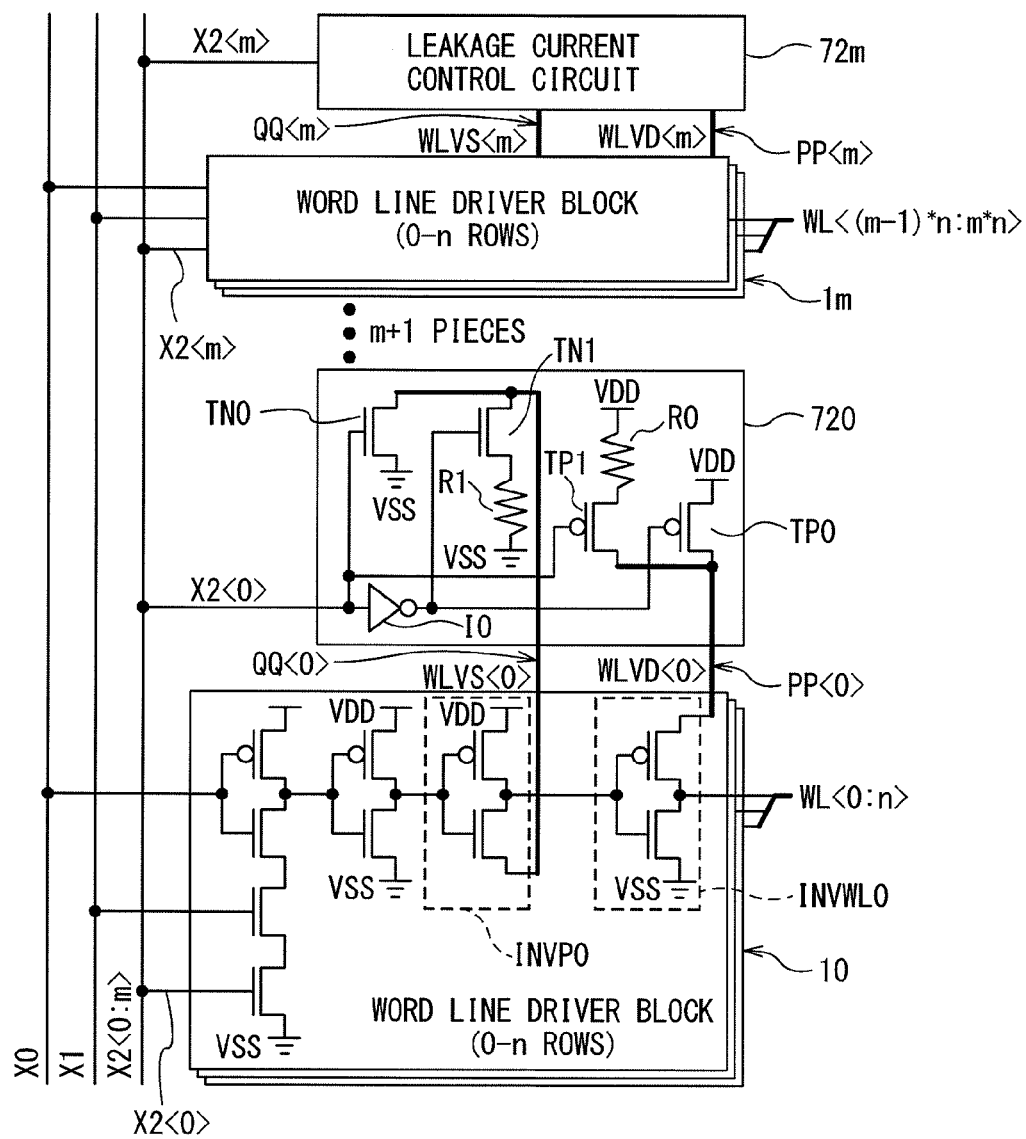
FIG. 19 is a block diagram illustrating the entire configuration of a word line driver in the semiconductor storage device applied with the second embodiment.
Figure 20:
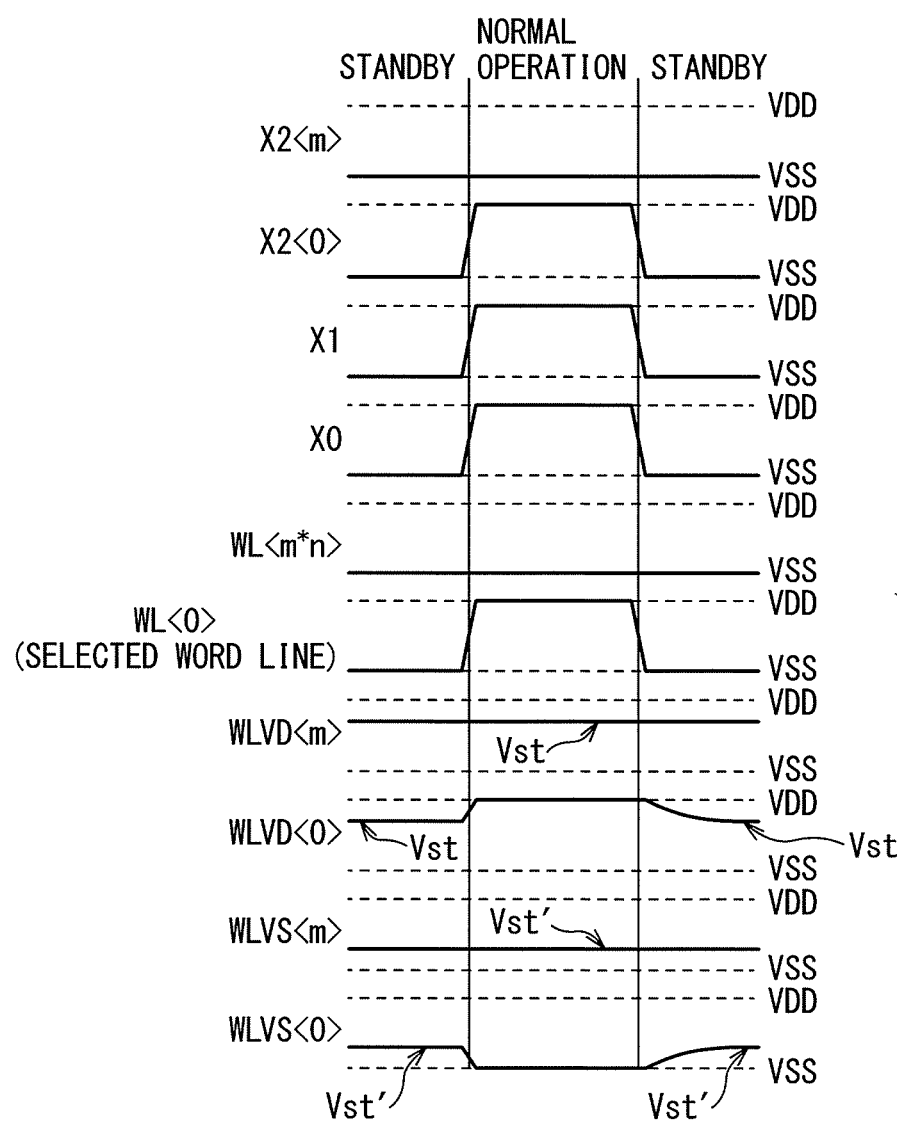
FIG. 20 is a timing diagram for describing an operation of the word line driver illustrated in FIG. 19.

FIG. 19 is a block diagram illustrating the entire configuration of a word line driver in the semiconductor storage device applied with the second embodiment, and FIG. 20 is a timing diagram for describing an operation of the word line driver illustrated in FIG. 19.

FIG. 19 is equivalent to one in which a word line driver includes a plurality of word line driver blocks 10 to 1m, and as leakage current control circuits 720 to 72m of the respective word line driver blocks, the leakage current control circuit 72 described with reference to FIG. 15 is applied.

As illustrated in FIG. 19, m+1 word line driver blocks 10 to 1m include the corresponding leakage current control circuits 720 to 72m, respectively. When, for example, the word line WL<0> is driven (selected), only the word line driver block 10 including WL<0> is caused to be in the normal operation mode and the other word line driver blocks 11 to 1m are caused to be in the standby mode.

In other words, the word line driver blocks 10 to 1m in FIG. 19 each correspond to the word line driver 1 in FIG. 15, and the leakage current control circuits 720 to 72m in FIG. 19 each correspond to the leakage current control circuit 72 in FIG. 15.

Further, power supply lines PP<0> to PP<m> of the respective word line driver blocks 10 to 1m in FIG. 19 each correspond to the power supply line PP of the word line driver 1 in FIG. 15, and voltages WLVD<0> to WLVD<m> thereof each correspond to the voltage WLVD in FIG. 16.

Further, power supply lines QQ<0> to QQ<m> of the respective word line driver blocks 10 to 1m in FIG. 19 each correspond to the power supply line QQ of the word line driver 1 in FIG. 15, and voltages WLVS<0> to WLVS<m> thereof each correspond to the voltage WLVS in FIG. 16.

In other words, as illustrated in FIG. 20, the voltage WLVD<0> of the power supply line PP<0> of the final stage inverter of the word line driver block 10 including the selected WL<0> is changed from the standby voltage Vst to the high-potential power supply voltage VDD by switching on the transistor TP0.

Further, the voltage WLVS<0> of the power supply line QQ<0> of the preinverter of the word line driver block 10 including the selected WL<0> is changed from the standby voltage Vst' to the low-potential power supply voltage VSS by switching on the transistor TN0.

All of the voltages WLVD<1> to WLVD<m> of the respective power supply lines PP<1> to PP<m> in the word line driver blocks 11 to 1m other than the word line driver block 10 are held at the standby voltage Vst and then the above leakage current reduction effect in the final stage inverter is produced.

Further, all of the voltages WLVS<1> to WLVS<m> of the respective power supply lines QQ<1> to QQ<m> in the word line driver blocks 11 to 1m other than the word line driver block 10 are held at the standby voltage Vst' and then the above leakage current reduction effect in the preinverter is produced.

The leakage current control circuit is not limited to a word line driver block where a plurality of word lines of an SRAM is used as a unit and may be provided for another semiconductor storage device including a DRAM or a semiconductor device including a plurality of circuit blocks that is switchable between selection and non-selection.

In this manner, the present embodiment makes it possible to quickly perform switching from the standby mode to the normal operation mode with suppressing leakage current of a block circuit (a word line driver or a word line driver block).

Further, the present embodiment makes it possible to balance an increase in speed of a return time from the standby mode to the normal operation mode and a reduction of leakage current when a voltage of the power supply line of each block circuit is controlled at an optimal voltage level with respect to each process corner in a transistor. The standby mode and the normal operation mode may be a non-selection state and a selection state, respectively.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a circuit block configured to be switchable between selection and non-selection; and
   a leakage current control circuit disposed between the circuit block and a first power supply line, wherein
   the leakage current control circuit includes:
      a first transistor disposed between the circuit block and the first power supply line;
      a resistor device disposed between the circuit block and the first power supply line; and
      a second transistor disposed between the circuit block and the first power supply line, the second transistor being connected in series to the resistor device, and wherein
   when the circuit block is selected and operated, the first transistor is switched on to connect the first power supply line with the circuit block,
   when the circuit block is caused to be non-selective and stopped, the first transistor is switched off to block the first power supply line from the circuit block, and
   the second transistor is switched off when the first transistor is switched on, and is switched on when the first transistor is switched off.

2. The semiconductor device according to claim 1, wherein the resistor device includes a characteristic where a resistance value increases with an increase in temperature.

3. The semiconductor device according to claim 2, wherein the resistor device is a silicide resistor.

4. A semiconductor storage device comprising:
   a word line driver block configured to be switchable between selection and non-selection; and
   a leakage current control circuit disposed between the word line driver block and a first power supply line, wherein
   the leakage current control circuit includes:
      a first transistor disposed between the word line driver block and the first power supply line;
      a first resistor device disposed between the word line driver block and the first power supply line; and
      a second transistor disposed between the word line driver block and the first power supply line, the transistor being connected in series to the first resistor device, and wherein
   when the word line driver block is selected and operated, the first transistor is switched on to connect the first power supply line with the word line driver block,
   when the word line driver block is caused to be non-selective and stopped, the first transistor is switched off to block the first power supply line from the word line driver block, and
   the second transistor is switched off when the first transistor is switched on, and is switched on when the first transistor is switched off.

5. The semiconductor storage device according to claim 4, wherein
   the leakage current control circuit further includes:
      an inverter configured to invert a first control signal input to a gate of the second transistor to input the inverted signal to a gate of the first transistor.

6. The semiconductor storage device according to claim 4, wherein
   the word line driver block includes a plurality of final stage inverters each driving a word line, and wherein
   the first transistor and the first resistor device are disposed between the first power supply line feeding a high-potential power supply voltage and a first local line connected to a source of a p-channel type MOS transistor in each of the plurality of final stage inverters.

7. The semiconductor storage device according to claim 5, wherein
   the first resistor device is connected to the first power supply line,
   the second transistor is connected to a first local line, and
   a second local line of the plurality of final stage inverters is connected to a second power supply line feeding a low-potential power supply voltage of which voltage value is lower than a voltage value of the high-potential power supply voltage.

8. The semiconductor storage device according to claim 7, wherein
   the word line driver block further includes:
      a plurality of preinverters disposed in a previous stage of the plurality of final stage inverters, the preinverters each driving corresponding final stage inverter, and
   the leakage current control circuit further includes:
      a third transistor disposed between the second power supply line and a third local line connected to a source of an n-channel type MOS transistor in each of the plurality of preinverters; and
      a second resistor device and a fourth transistor connected in series between the second power supply line and the third local line, and wherein
   when the word line driver block is selected and operated, the third transistor is switched on and the fourth transistor is switched off, and when the word line driver block is caused to be nonselective and stopped, the third transistor is switched off and the fourth transistor is switched on.

9. The semiconductor storage device according to claim 8, wherein the second resistor device is connected to the second power supply line, the fourth transistor is connected to the third local line, and a fourth local line of the plurality of preinverters is connected to the first power supply line.

10. The semiconductor storage device according to claim 8, wherein the first transistor and the second transistor are each a p-channel type MOS transistor, and the third transistor and the fourth transistor are each an n-channel type MOS transistor.

11. The semiconductor storage device according claim 4, wherein the first resistor device includes a characteristic where a resistance value increases with an increase in temperature.

12. The semiconductor storage device according to claim 11, wherein the first resistor device is a silicide resistor.

13. The semiconductor storage device according to claim 8, wherein the second resistor device includes a characteristic where a resistance value increases with an increase in temperature.

14. The semiconductor storage device according to claim 13, wherein the second resistor device is a silicide resistor.

15. The semiconductor storage device according to claim 4, wherein the semiconductor storage device is an SRAM.

16. The semiconductor storage device according claim 4, wherein the semiconductor storage device comprises a plurality of the word line driver blocks each of which includes the leakage current control circuit.

* * * * *